US012754243B2

(12) United States Patent
Bharathraj et al.

(10) Patent No.: US 12,754,243 B2
(45) Date of Patent: Oct. 6, 2026

(54) METHOD AND APPARATUS WITH BATTERY PARAMETERS DETERMINATION

(71) Applicant: SAMSUNG ELECTRONICS CO., LTD., Suwon-si (KR)

(72) Inventors: Sagar Bharathraj, Bengaluru (IN); Shashishekara Parampalli Adiga, Bengaluru (IN)

(73) Assignee: Samsung Electronics Co., Ltd., Suwon-si (KR)

( * ) Notice: Subject to any disclaimer, the term of this patent is extended or adjusted under 35 U.S.C. 154(b) by 498 days.

(21) Appl. No.: 18/319,116

(22) Filed: May 17, 2023

(65) Prior Publication Data

US 2023/0384382 A1 Nov. 30, 2023

(30) Foreign Application Priority Data

| | | |
|---|---|---|
| May 25, 2022 | (IN) | 202241030074 |
| Jul. 7, 2022 | (IN) | 202241030074 |
| Jan. 3, 2023 | (KR) | 10-2023-0000886 |

(51) Int. Cl.

*G01R 31/367* (2019.01)
*G01R 31/388* (2019.01)
*G01R 31/392* (2019.01)

(52) U.S. Cl.

CPC ......... *G01R 31/367* (2019.01); *G01R 31/388* (2019.01); *G01R 31/392* (2019.01)

(58) Field of Classification Search

None

See application file for complete search history.

(56) References Cited

U.S. PATENT DOCUMENTS

| | | | |
|---|---|---|---|
| 10,566,811 | B2 | 2/2020 | Howey et al. |
| 2018/0198300 | A1 | 7/2018 | Howey et al. |
| 2019/0162791 | A1 | 5/2019 | Farag et al. |
| 2020/0122581 | A1 | 4/2020 | Wu et al. |
| 2022/0013813 | A1 | 1/2022 | Kim et al. |
| 2022/0074995 | A1 | 3/2022 | Bharathraj et al. |

FOREIGN PATENT DOCUMENTS

| | | | |
|---|---|---|---|
| CN | 111444625 | A | 7/2020 |
| JP | 2014-120200 | A | 6/2014 |
| KR | 10-2018-0082936 | A | 7/2018 |

(Continued)

OTHER PUBLICATIONS

Extended European search report issued on Nov. 6, 2023, in counterpart European Patent Application No. 23172035.0 (8 pages).

(Continued)

*Primary Examiner* — Raymond L Nimox
(74) *Attorney, Agent, or Firm* — NSIP Law

(57) ABSTRACT

Methods and an electronic devices for estimating battery parameters, where the method of estimating battery parameters performed by a processor includes determining whether a diffusion length of an intercalation material in an electrode of a battery is lesser than a threshold, calculating a concentration of the intercalation material in the electrode based on a result of the determination, and estimating at least one battery parameter of the battery parameters based on the concentration of the intercalation material.

20 Claims, 12 Drawing Sheets

(56) References Cited

FOREIGN PATENT DOCUMENTS

| | | | | | |
|---|---|---|---|---|---|
| KR | 20180082936 A | * | 7/2018 | ......... | G01R 31/3651 |
| KR | 10-2022-0033978 A | | 3/2022 | | |

OTHER PUBLICATIONS

Choi et al. "Prognostics and Health Management for Battery Remaining Useful Life Prediction Based on Electrochemistry Model: A Tutorial." *The Journal of Korean Institute of Communications and Information Sciences* vol. 42. Issue 4 (2017). pp. 939-949.

Ramachandran et al. "Rapid analysis of charging profiles of lithium ion batteries using a hybrid simplified electrochemical model." *Journal of the Electrochemical Society* vol. 163. Issue 6 (2016): A1101-A1111.

V. Senthil Kumar "Reduced order model for a lithium ion cell with uniform reaction rate approximation." *Journal of power sources* vol. 222 (2013). pp. 426-441.

Indian Office Action issued on Jun. 18, 2025 in corresponding Indian Patent Application No. 202241030074. (8 pages in Indian).

* cited by examiner

METHOD AND APPARATUS WITH BATTERY PARAMETERS DETERMINATION

CROSS-REFERENCE TO RELATED APPLICATIONS

This application claims the benefit under 35 USC § 119(a) of Indian Provisional Patent Application No. 202241030074 filed on May 25, 2022, and Indian Patent Application No. 202241030074 filed on Jul. 7, 2022, in the Indian Patent Office, and Korean Patent Application No. 10-2023-0000886 filed on Jan. 3, 2023, in the Korean Intellectual Property Office, the entire disclosures of which are incorporated herein by reference for all purposes.

BACKGROUND

1. Field

The present disclosure relates to a method and an electronic device for estimating battery parameters.

2. Description of Related Art

Generally, there are many consumers for wireless devices such as mobile phones, laptops, tablets, smart watches, and the like. Usually, a rechargeable battery (e.g., a lithium (Li) ion battery) provides portable electricity and power to such wireless devices. Electric vehicles are also operated using electrical energy stored in the rechargeable battery. However, the battery degrades due to usage and the passage of time, which leads to losses. Thus, the useful, extractable power of the battery decreases over a period of time. Hence, precise state of charge (SOC) estimation facilitates an effective battery management system (BMS).

Single Particle Models (SPM) are popularly used for state estimation due to their accuracy, speed, and computational efficiency. But the accuracy of the SOC estimated by an SPM generally suffers under low characteristic diffusivity length conditions as the profile approximations used fail and are invalid. For example, existing SPM under Low diffusion lengths (like low temperatures/initial times) conditions have an accumulated SOC error that may be greater than 20% for a single discharge. Such erroneous SOC estimates may lead to problems like over discharge, accelerated ageing, short circuits, and the like.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a method of estimating battery parameters performed by a processor, the method including determining whether a diffusion length of an intercalation material in an electrode of a battery is lesser than a threshold, calculating a concentration of the intercalation material in the electrode based on a result of the determination, and estimating at least one battery parameter of the battery parameters based on the concentration of the intercalation material.

The determining of whether the diffusion length of the intercalation material is lesser than the threshold may include determining whether the diffusion length is lesser than the threshold based on a diffusivity of the intercalation material in the electrode, a value of a time variable, and a radius of the electrode.

The determining of whether the diffusion length of the intercalation material is lesser than the threshold may include determining that the diffusion length is lesser than the threshold in response to a square root of a product of a diffusivity of the intercalation material and a value of a time variable being lesser than a product of a radius of the electrode and a coefficient less than 1.

The calculating of the concentration of the intercalation material may include calculating parameters comprising an equilibrium concentration of the intercalation material, a scaled concentration of the intercalation material, a reaction flux, a diffusivity of the intercalation material in the electrode, and a value of a time variable, in response to the diffusion length of the intercalation material being lesser than the threshold, and calculating a concentration of the intercalation material based on the parameters.

The calculating of the concentration of the intercalation material may include calculating a scaled concentration of the intercalation material based on a similarity variable.

The calculating of the scaled concentration may include calculating the similarity variable based on a thickness of a boundary of the electrode, a diffusivity of the intercalation material in the electrode, and a value of a time variable.

The estimating of the at least one battery parameter may include estimating at least one of a state of health of the battery, a state of charge of the battery, electrochemical parameters of the battery, or a state of short of the battery.

The estimating of the at least one battery parameter may include estimating at least one of a state of charge of the battery or electrochemical parameters of the battery based on an open circuit voltage and electrode time constant dependent logarithmic voltage profiles.

The estimating of the at least one battery parameter may include estimating electrochemical parameters of the battery, and estimating at least one of a state of health of the battery or a state of short of the battery based on the electrochemical parameters.

In another general aspect, there is provided an electronic device for estimating battery parameters, the electronic device including a processor configured to determine whether a diffusion length of an intercalation material in an electrode of a battery is less than a threshold, calculate a concentration of the intercalation material in the electrode based on a result of the determination, and estimate at least one battery parameter of the battery parameters based on the concentration of the intercalation material.

The processor may be configured to determine whether the diffusion length is lesser than the threshold based on a diffusivity of the intercalation material in the electrode, a value of a time variable, and a radius of the electrode.

The processor may be configured to determine that the diffusion length is lesser than the threshold in response to a square root of a product of a diffusivity of the intercalation material and a value of a time variable being lesser than a product of a radius of the electrode and a coefficient less than 1.

The processor may be configured to calculate parameters comprising an equilibrium concentration of the intercalation material, a scaled concentration of the intercalation material, a reaction flux, a diffusivity of the intercalation material in the electrode, and a value of a time variable, in response to the diffusion length of the intercalation material being lesser than the threshold, and calculate a concentration of the intercalation material based on the parameters.

The processor may be configured to calculate a scaled concentration of the intercalation material based on a similarity variable.

The processor may be configured to calculate the similarity variable based on a thickness of a boundary of the electrode, a diffusivity of the intercalation material, and a value of a time variable.

The processor may be configured to estimate at least one of a state of health of the battery, a state of charge of the battery, electrochemical parameters of the battery, or a state of short of the battery.

The processor may be configured to estimate at least one of a state of charge of the battery or electrochemical parameters of the battery based on an open circuit voltage and electrode time constant dependent logarithmic voltage profiles.

The processor may be configured to estimate electrochemical parameters of the battery, and estimate at least one of a state of health of the battery or a state of short of the battery based on the electrochemical parameters.

The processor may be configured to calculate the concentration of the intercalation material in the electrode, in response to a diffusion length of a positive electrode and a negative electrode of the battery being lesser than the threshold.

Other features and aspects will be apparent from the following detailed description, the drawings, and the claims.

Figure 1A:
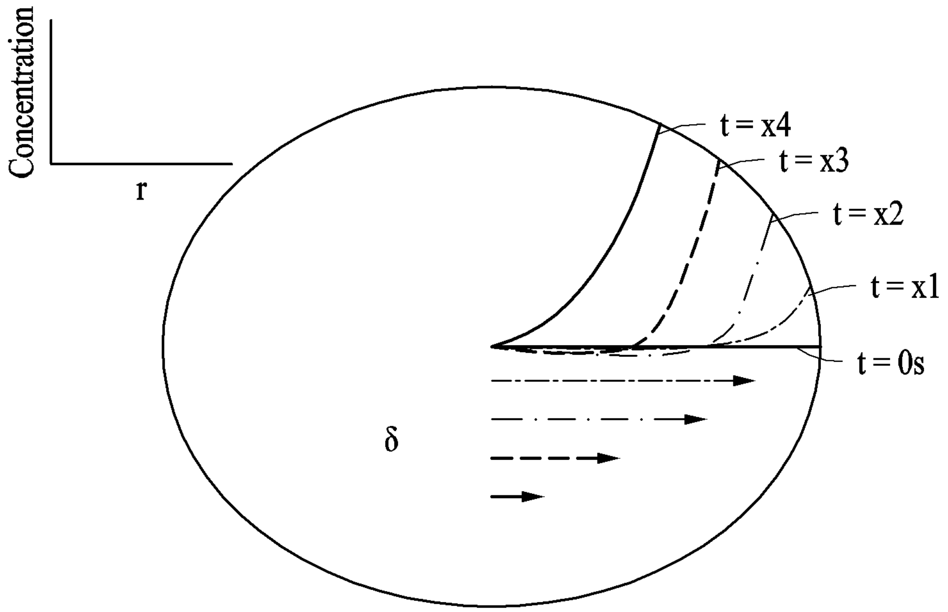
FIG. 1A (RELATED ART)
FIG. 1A illustrates an example of a boundary level evolution with time of concentration of intercalation material in the electrode according to a related art.

Throughout the drawings and the detailed description, unless otherwise described or provided, it shall be understood that the same or like drawing reference numerals refer to the same or like elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third", or A, B, (a), (b), and the like may be used herein to describe various members, components, regions, layers, portions, or sections, these members, components, regions, layers, portions, or sections are not to be limited by these terms. Each of these terminologies is not used to define an essence, order, or sequence of corresponding members, components, regions, layers, portions, or sections, for example, but used merely to distinguish the corresponding members, components, regions, layers, portions, or sections from other members, components, regions, layers, portions, or sections. Thus, a first member, component, region, layer, portions, or section referred to in the examples described herein may also be referred to as a second member, component, region, layer, portions, or section without departing from the teachings of the examples.

Throughout the specification, when a component or element is described as being "connected to," "coupled to," or "joined to" another component or element, it may be directly "connected to," "coupled to," or "joined to" the other component or element, or there may reasonably be one or more other components or elements intervening therebetween. When a component or element is described as being "directly connected to," "directly coupled to," or "directly joined to" another component or element, there can be no other elements intervening therebetween. Likewise, expressions, for example, "between" and "immediately between" and "adjacent to" and "immediately adjacent to" may also be construed as described in the foregoing. As used herein, the term "and/or" includes any and all combinations of one or more of the associated listed items. For example, "A and/or B" may be interpreted as "A," "B," or "A and B."

The terminology used herein is for the purpose of describing particular examples only and is not to be limiting of the examples. The singular forms "a," "an," and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

FIG. 1A illustrates an example of a boundary level evolution with time of concentration of intercalation material in the electrode according to a related art. When a flux is applied at surface of the electrode, the concentration penetrates to a distance but does not reach the center. This distance that the concentration penetrates is called boundary layer, δ (from the center or R-y) and evolves with time as shown in FIG. 1A. As can be seen in FIG. 1A, rate of penetration may decrease over time (over time, penetration may take longer).

Figure 1B:
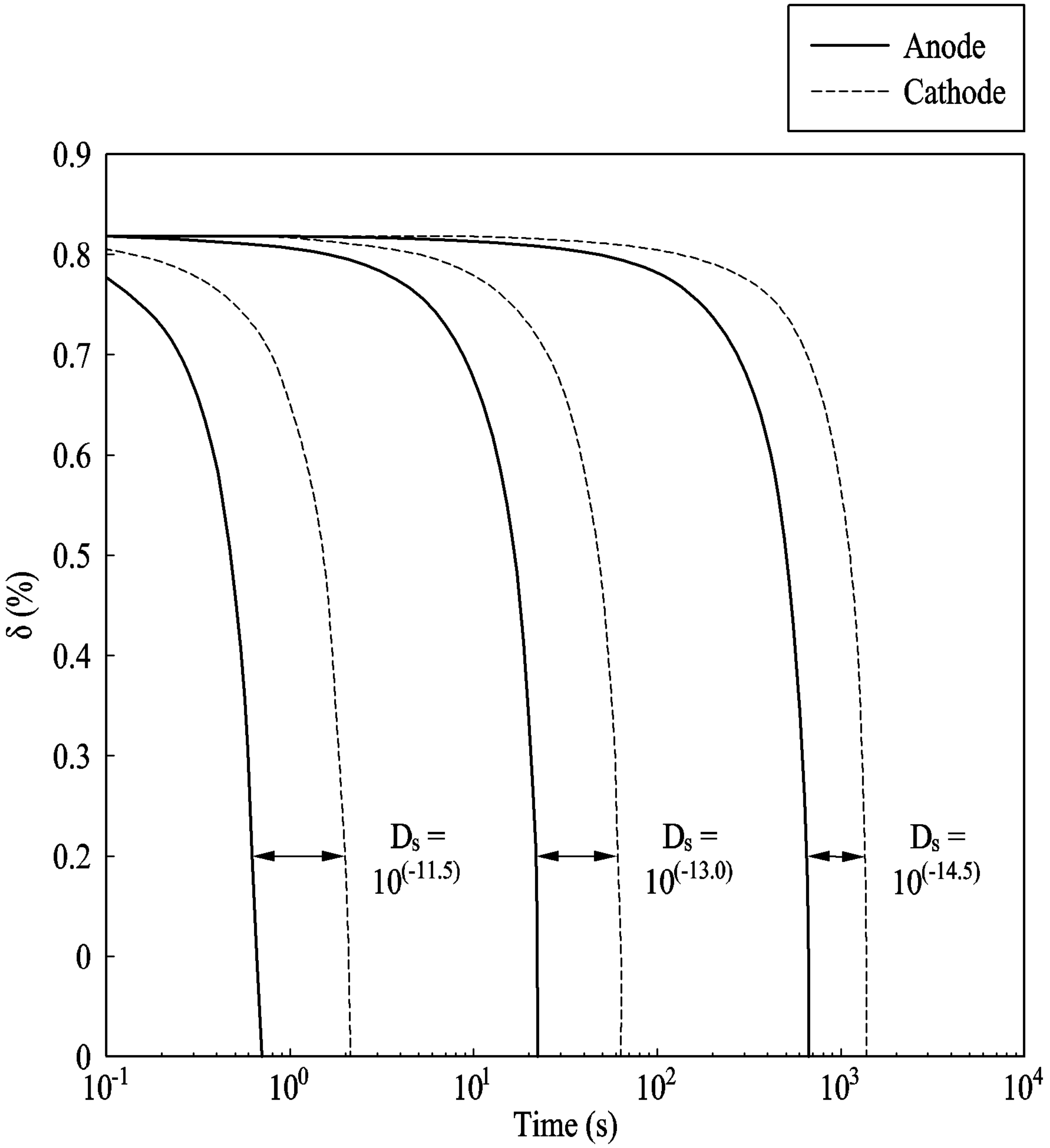
FIG. 1B (RELATED ART)
FIG. 1B illustrates an example of a graph representing change in diffusivity with respect to temperature according to a related art.

FIG. 1B illustrates an example of a graph representing change in diffusivity with respect to temperature according to a related art. As shown in FIG. 1B, this distance is plotted as a fraction of the total radius for different diffusivities (diffusivities respectively corresponding to high, room, and low temperatures, from left to right) with time. As may be seen from FIG. 1B, it takes easily 40 to 60 seconds at room temperature (RT), for example, when the temperature is between 10° C. and 35° C., and 1000 seconds or less at low temperature (LT), for example, when the temperature is less than 10° C., for the flux to reach the particle center (e.g., when δ=0 or y=R). Only after this are normal conservation equations and profile approximations likely to be valid. Thus, when √(Dt)<<R, an alternate approach is needed, else leading to erroneous SOC profiles for times up to 1000 seconds at less than or equal to 5° C., where D denotes low diffusivities, T denotes an initial time, R denotes a radius of an electrode particle, and y denotes a boundary layer thickness.

Figure 1C:
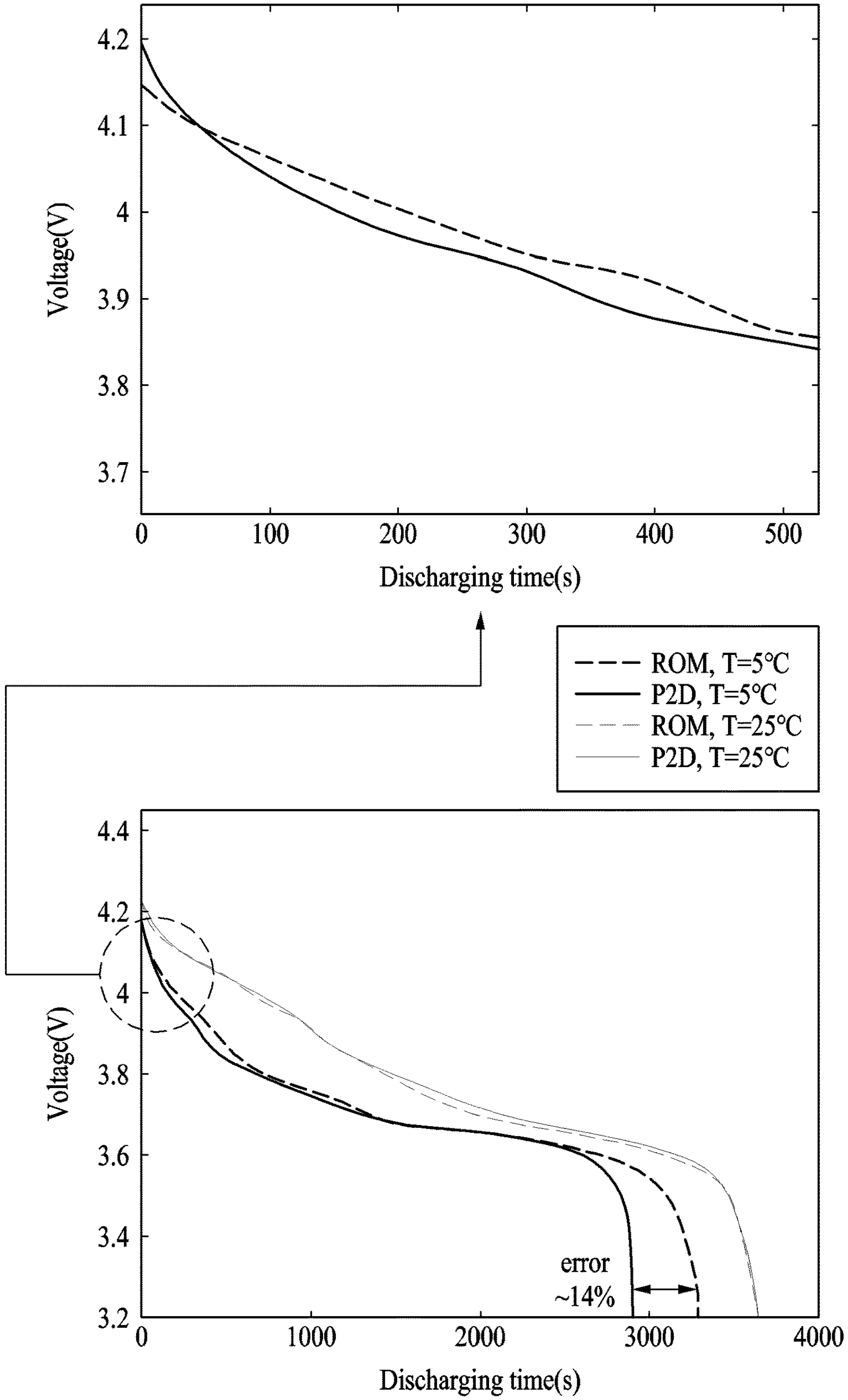
FIG. 1C (RELATED ART)
FIG. 1C illustrates an example of a graph representing comparison between actual and estimated voltage of a battery according to a related art.

FIG. 1C illustrates an example of a graph representing a comparison between actual and estimated voltage of a battery according to a related art. The accumulated SOC errors may lead to a substantial discrepancy between actual and calculated parameters like cell capacity. The full order pseudo-two-dimensional (P2D) and reduced order model (ROM) 1C discharge capacities for the same cell parameters at a Ds=10-13 m2/s (T=25° C.) and 10-14 (T=5° C.) is shown in FIG. 1C. As may be seen from FIG. 1C, the voltage as calculated by existing ROM is less than or equal to 14% more than the voltage calculate by P2D. In an example, P2D refers to an actual profile of the battery and ROM refers to an estimated profile of the battery (according to existing techniques). Also, the LT attribute of an exponential decay in voltage at initial times is not captured in ROM.

At RT (room temperature) or temperature of 25° C., the boundary layer exists for only t=60 seconds after which the flux reaches the center and profile approximations work. In another example, at a temperature of −5° C., the boundary layer exists for a time t of 900 seconds or less, due to the very low diffusivity. This boundary layer is not addressed by present SPM formulations like ROM and the errors are magnified at lower temperatures.

Figure 1D:
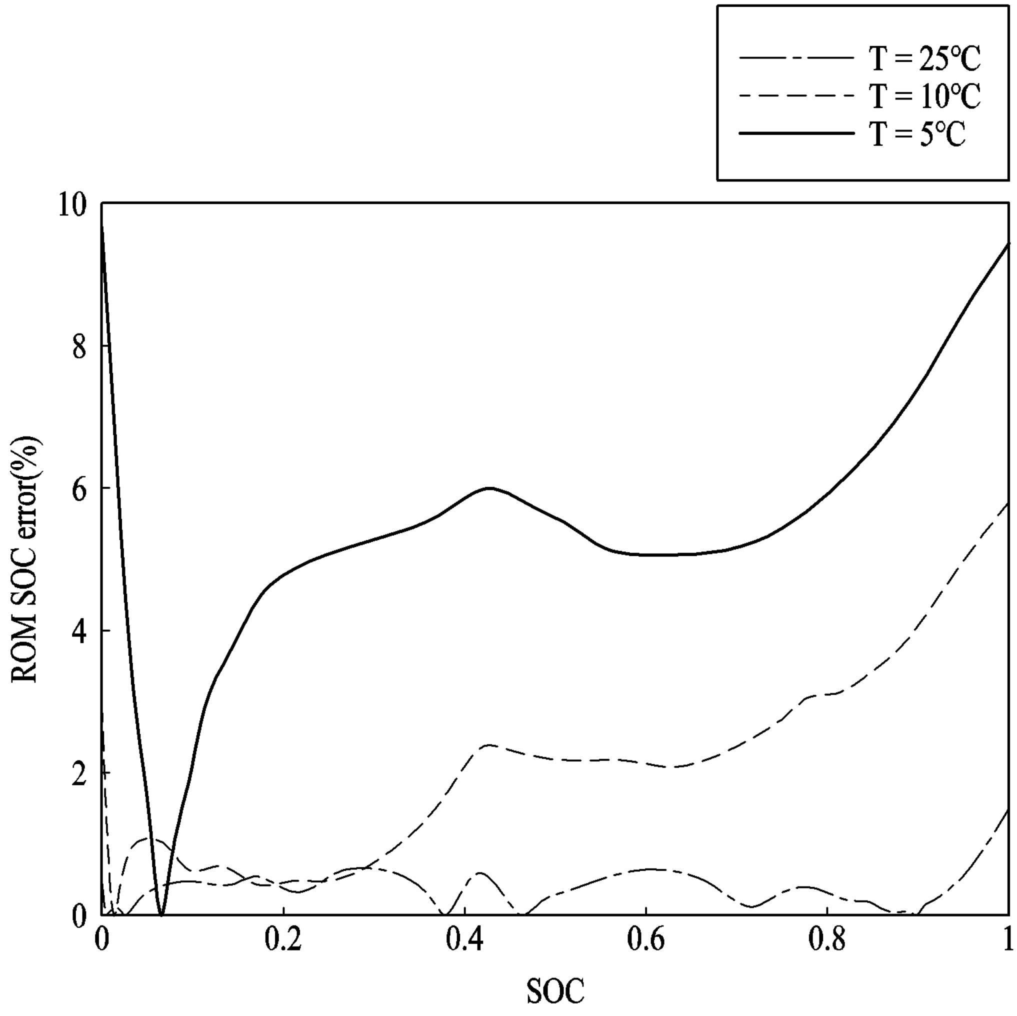
FIG. 1D (RELATED ART)
FIG. 1D illustrates an example of a graph representing particle level SOC profiles as predicted by reduced order model (ROM) according to a related art.

FIG. 1D illustrates an example of a graph representing particle level SOC profiles as predicted by ROM according to a related art. The particle level SOC profiles as predicted by ROM and P2D, as shown in FIG. 1D, during the existence of the boundary layer show that ROM fails at low diffusion lengths.

Figure 1E:
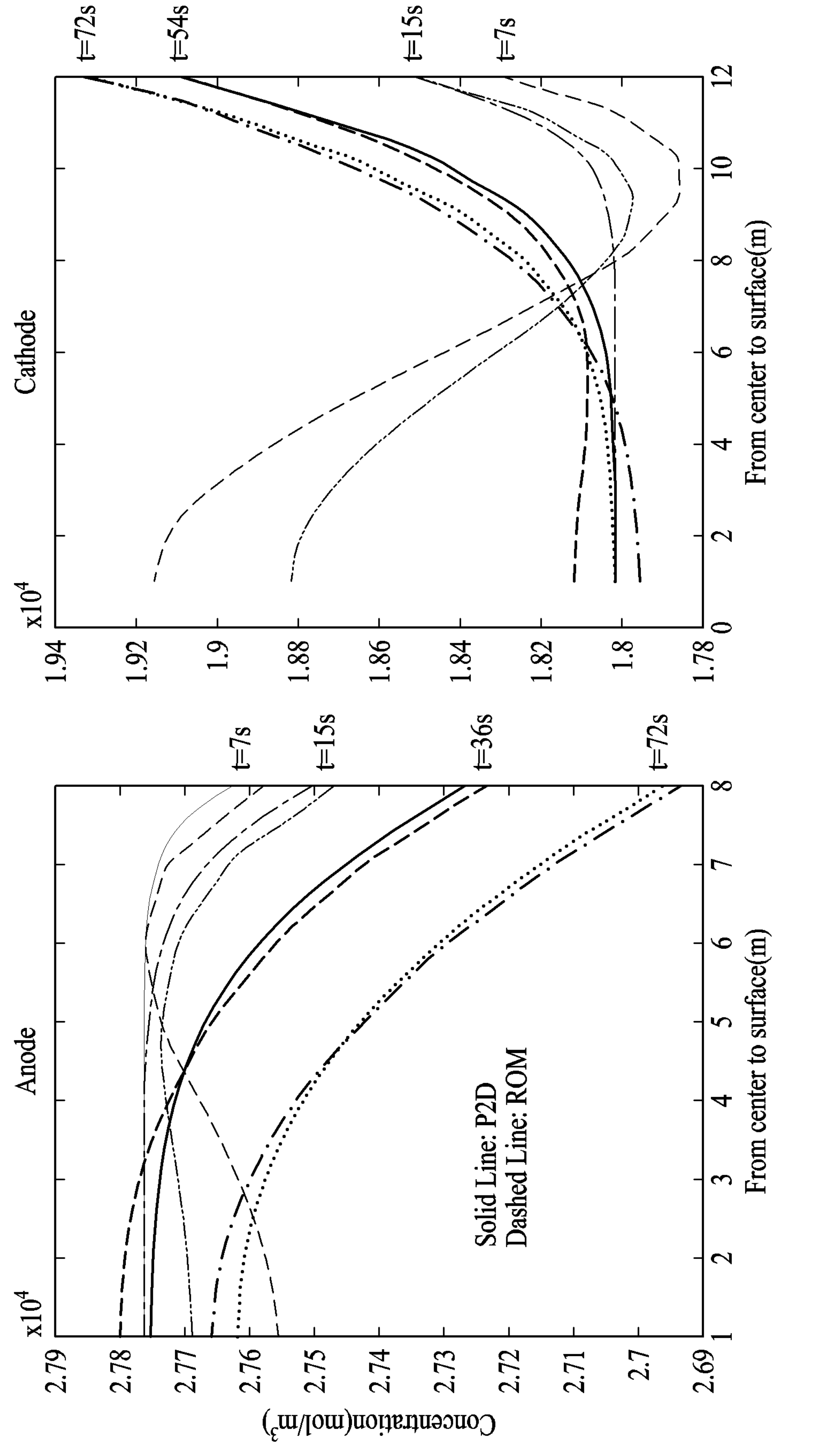
FIG. 1E (RELATED ART)
FIG. 1E illustrates an example of a graph representing comparison between actual and estimated state of charge (SOC) in anode and cathode according to a related art.

FIG. 1E illustrates an example of a graph representing comparison between actual and estimated SOC in anode and cathode according to a related art. Even though the discharge capacity at RT seems to match between ROM and P2D, on close inspection of particle level SOC and concentration profiles, it may be observed that there are major issues with ROM predictions and its assumptions. The concentration profile inside the anode and cathode particles at initial times of 1C discharge for ROM and P2D are shown in FIG. 1E. The ROM profiles deviate considerably from the corresponding P2D profiles for t<20 seconds for anode and t<60 seconds for cathode. This corresponds to exactly t=(0.01R^2)/D. As cathode particles (e.g., cathode particles of a size of 12μ) are larger than anode (e.g., anode particles of a size of 7μ), it takes longer for the flux to reach the particle center in the cathode than the particle center in the anode. This takes up to 1000 seconds at low diffusivities (e.g., diffusivity of 10-14.5). Not only are the profiles not matching, but the ROM profiles greatly differ at times. For example: the cathode profile at t=7 seconds and t=15 seconds in ROM, implies that there is another source of flux inside the particle causing the reversal of profile shape inside the particle (e.g., a decrease and increase) to happen.

Thus, for initial times and/or low temperatures, i.e., √(Dt)<<R, the ROM formulations, profile approximations, and SOC calculations are incorrect leading to serious lapses like erroneous capacity calculations, over charge (over discharge), unexpected shut down ultimately leading to health and safety issues like aging and shorting, and the like.

Hence, there is a need for accurate estimation of SOC in low diffusivity. Accordingly, the following describes provides a method and system for accurate estimation of SOC in low diffusivity.

Figure 2:
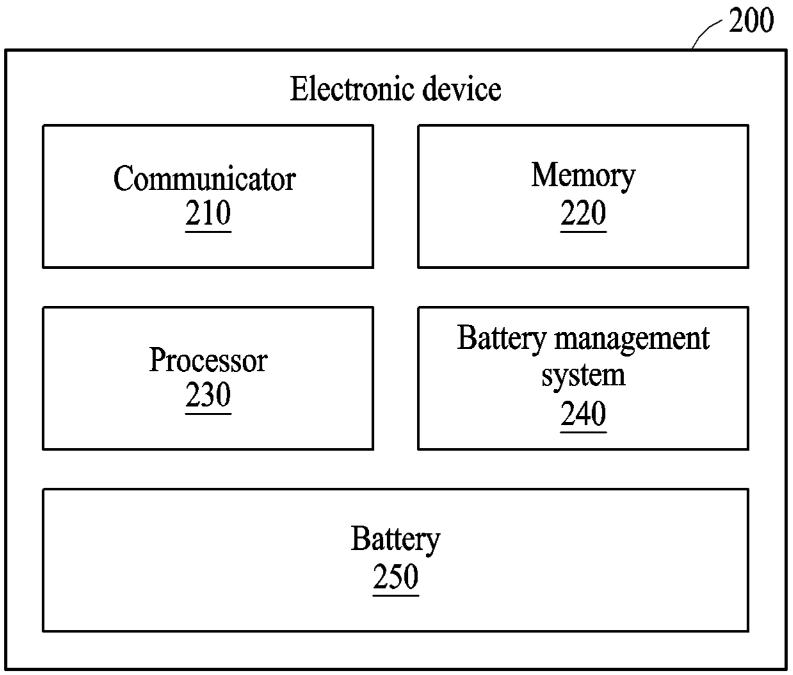
FIG. 2 illustrates an example of a wireless device for estimating battery parameters.

FIG. 2 illustrates an example of an electronic device (e.g., an electronic device 200) for detecting (predicting) short circuits in a battery. Examples of the electronic device 200 may include, but are not limited to, a computing device and a vehicle.

In some examples, the vehicle refers to any mode of transportation, delivery, or communication such as, for example, for example, an automobile, a truck, a tractor, a scooter, a motorcycle, a cycle, an amphibious vehicle, a snowmobile, a boat, a public transit vehicle, a bus, a monorail, a train, a tram, an autonomous vehicle, an unmanned aerial vehicle, a bicycle, a walking assist device (WAD), a robot, a drone, and a flying object such as an airplane. In some examples, the vehicle may be, for example, an autonomous vehicle, a smart mobility, an electric vehicle, an intelligent vehicle, an electric vehicle (EV), a plug-in hybrid EV (PH EV), a hybrid EV (HEV), or a hybrid vehicle, an intelligent vehicle equipped with an advanced driver assistance system (ADAS) and/or an autonomous driving (AD) system.

The electronic device 200 may also include, but is not limited to, a device, an apparatus or a system for estimating battery parameters in a rest period of an electric vehicle or a battery parameters estimation device for electric vehicles, or the like.

In some examples, the computing device may be implemented as, or in, various types of devices, such as, for example, a personal computer (PC), a data server, or a portable device. In an example, the portable device may be implemented as a laptop computer, a mobile phone, a smart phone, a tablet PC, a mobile internet device (MID), a personal digital assistant (PDA), an enterprise digital assistant (EDA), a digital still camera, a digital video camera, a portable multimedia player (PMP), a personal navigation device or portable navigation device (PND), or a smart device. In an example, the computing devices may be a wearable device, such as, for example, a smart watch and an apparatus for providing augmented reality (AR) (hereinafter simply referred to as an AR provision device) such as AR glasses, a head mounted display (HMD), various Internet of Things (IoT) devices that are controlled through a network, and other consumer electronics/information technology (CE/IT) devices.

Referring to FIG. 2, the electronic device 200 may include a communicator 210, a memory 220, a processor 230, a battery management system (BMS) 240, and the battery 250.

The communicator 210 may be configured for communicating internally between the components of the electronic device 200 and external devices such as, for example, other wireless devices, computing devices, vehicles, printers, fax machines, and the like, via one or more networks. The memory 220 may store instructions to be executed by the processor 230.

The memory 220 may store information used to determine the parameters. For example, the memory 220 may store the sensing data, diffusion length of an intercalation material, threshold values, and the determined parameters. However, this is only an example, and the information stored in the memory 220 is not limited thereto. In an example, the memory 220 may store a program (or an application, or software) in the form of instructions. The stored program may be a set of syntaxes that are coded and executable by the processor 230 to operate the electronic device 200. The memory 220 may include a volatile memory or a non-volatile memory.

The volatile memory may be implemented as a dynamic random-access memory (DRAM), a static random-access memory (SRAM), a thyristor RAM (T-RAM), a zero capacitor RAM (Z-RAM), or a twin transistor RAM (TTRAM).

The non-volatile memory may be implemented as an electrically erasable programmable read-only memory (EEPROM), a flash memory, a magnetic RAM (MRAM), a spin-transfer torque (STT)-M RAM, a conductive bridging RAM (CBRAM), a ferroelectric RAM (FeRAM), a phase change RAM (PRAM), a resistive RAM (RRAM), a nanotube RRAM, a polymer RAM (PoRAM), a nano floating gate Memory (NFGM), a holographic memory, a molecular electronic memory device), or an insulator resistance change memory. Further details regarding the memory 220 are provided below.

The processor 230 may be configured to execute instructions stored in the memory 220 and to perform various operations. The processor 230 may control at least one other component of the electronic device 200 and perform processing of various pieces of data or computations. The processor 230 may control an overall operation of the electronic device 200 and may execute corresponding processor-readable instructions for performing operations of the electronic device 200. The processor 230 may execute, for example, software stored in the memory 220 to control one or more hardware components, such as, battery management system 240 of the electronic device 200 connected to the processor 230 and may perform various data processing or operations, and control of such components.

The processor 230 may determine one or more parameters diffusion length of an intercalation material, compare the diffusion length to the threshold values, and calculate a concentration of the intercalation material in the electrode. In some examples, the processor 230 may determine whether the diffusion length is less than the threshold based on diffusivity of the intercalation material in the electrode, a value of a time variable, and a radius of the electrode. In some examples, the processor 230 may calculate the concentration of the intercalation material based on the calculated parameters. However, the operation of the processor 230 is not limited thereto, and the processor 230 may perform at least one of the operations described with reference to FIGS. 2 to 6 in parallel or in a time series.

The processor 230 may be a single processing unit or several units, all of which could include multiple computing units. The processor 230 may be implemented as one or more microprocessors, microcomputers, microcontrollers, digital signal processors, central processing units, state machines, logic circuitries, and/or any devices that manipulate signals based on operational instructions. Among other capabilities, the processor 230 is configured to fetch and execute computer-readable instructions and data stored in the memory 220.

The processor 230 may be a hardware-implemented data processing device. The hardware-implemented data processing device 230 may include, for example, a main processor (e.g., a central processing unit (CPU), a field-programmable gate array (FPGA), or an application processor (AP)) or an auxiliary processor (e.g., a GPU, a neural processing unit (NPU), an image signal processor (ISP), a sensor hub processor, or a communication processor (CP)) that is operable independently of, or in conjunction with the main processor. Further details regarding the processor 230 are provided below.

In some examples, the memory 220 may be configured to store larger amounts of information than a memory 220. In certain examples, a non-transitory storage medium may store data that may, over time, change (e.g., in random access memory (RAM) or cache).

The BMS 240 is coupled to the memory 220, the processor 230 and the battery 250. The BMS 240 may be an electronic system which manages the battery 250, for example, a rechargeable battery (a cell or the battery pack). The BMS 240 is configured to manage the charging and discharging of the battery 250, to provide notifications on a status of the battery 250 and also to provide critical safeguards to protect the battery 250 from damage, such as detection of a short circuit. The battery 250 may be the rechargeable battery. An example of the rechargeable battery may be a Lithium Ion battery (LIB).

Although, FIG. 2 illustrates hardware elements of the electronic device 200, it is to be understood that other embodiments are not limited thereto. In other embodiments, the electronic device 200 may include a smaller or greater number of elements. Further, the labels or names of the elements are used only for illustrative purposes and do not limit the scope of the present disclosure.

Figure 3:
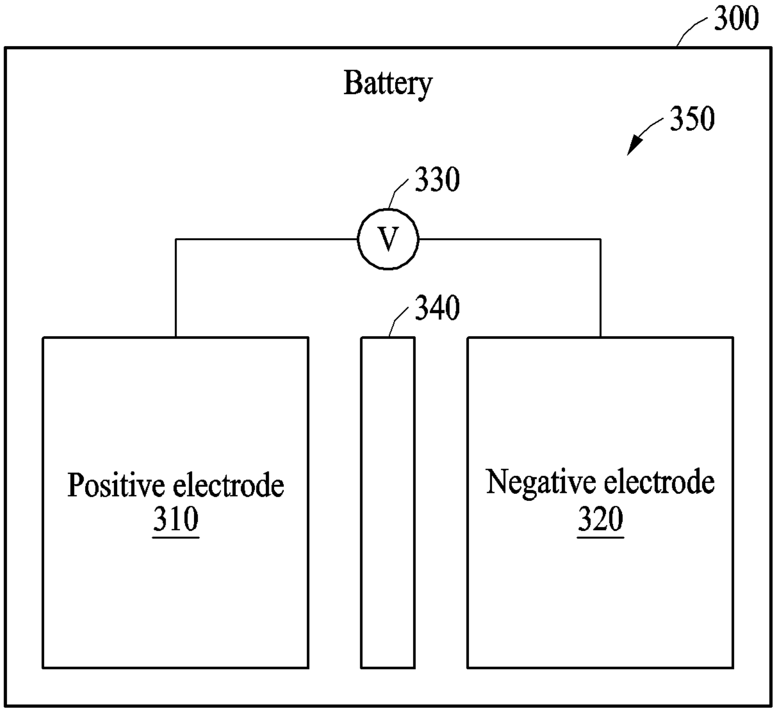
FIG. 3 illustrates an example of a battery of a wireless device.

FIG. 3 illustrates an example of a battery 300 of an electronic device. The battery 300 may include any battery that has a membrane (e.g., a separator) separating positive and negative electrodes (e.g., a lithium-ion battery, a lithium-polymer battery, etc.). The battery 300 may have a variety of shapes and sizes, depending on the shape and size of electronic device 200, the amount of power required by electronic device 200, etc. As illustrated in FIG. 2, the battery 300 may include a positive electrode 310, a negative electrode 320, a voltage source 330, a separator 340, and/or an electrolyte 350. In some examples, the battery 300 may provide power to components of the electronic device 200.

In some examples, positive electrode 310 may include an electrode through which positive electric current flows into a polarized electrical device. The positive electrode 310 may be made of a variety of shapes and sizes, depending on the shape and size of the battery 300, and may be made from a variety of materials.

The negative electrode 320 may include an electrode through which positive electric current flows out of a polarized electrical device. The negative electrode 320 may be made of a variety of shapes and sizes, depending on the shape and size of the battery 300, and may be made from a variety of materials.

The voltage source 330 may be used to charge the battery 300.

The separator 340 may separate positive electrode 310 and negative electrode 320, and may include a membrane (e.g., a microporous membrane). The separator 340 may be made of a variety of shapes and sizes, depending on the shape and size of the battery 300.

The electrolyte 350 may include any liquid substance which acts as a medium to conduct electricity between the positive electrode 310 and the negative electrode 320, and to store energy on the positive electrode 310 and the negative electrode 320. The electrolyte 350 may depend on the type and purpose of the battery 300.

In some examples, the battery 300 may be a lithium-ion battery. Although FIG. 3 shows exemplary components of the battery 300, in other implementations, the battery 300 may contain fewer, different, or additional components than depicted in FIG. 3.

In order to prevent any health and safety issues associated with short circuits of the battery 300, in some examples described below in connection with FIGS. 4 to 7B, an accurate SOC may be estimated for a low diffusivity condition in the battery 300.

Figure 4:
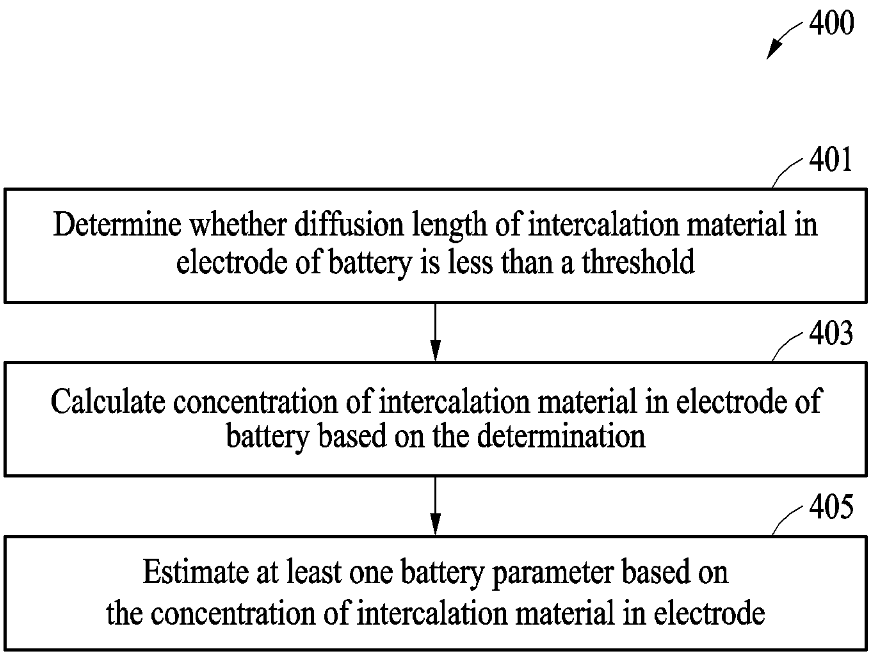
FIG. 4 illustrates an example of a method estimating battery parameters.

FIG. 4 illustrates an example of a method 400 for estimating battery parameters. The operations of FIG. 4 may be performed in the sequence and manner as shown. However, the order of some operations may be changed, or some of the operations may be omitted, without departing from the spirit and scope of the shown example. Additionally, operations illustrated in FIG. 4 may be performed in parallel or simultaneously. One or more blocks of FIG. 4, and combinations of the blocks, can be implemented by special purpose hardware-based computer that perform the specified functions, or combinations of special purpose hardware and instructions, e.g., computer or processor instructions. For example, operations 401 through 405 may be performed by a computing apparatus (e.g., processor 502 or the system 500 of FIG. 5). In addition to the description of FIG. 4 below, the descriptions of FIGS. 2-3 are also applicable to FIG. 4 and are incorporated herein.

Figure 5:
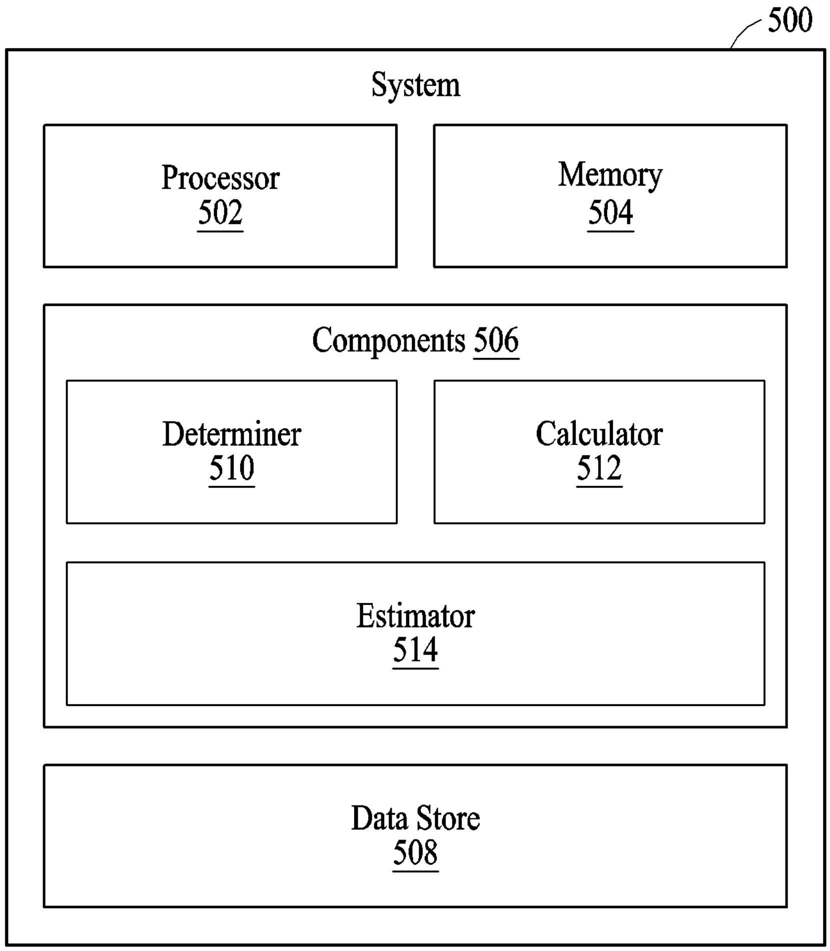
FIG. 5 illustrates an example of a system for estimating battery parameters.

FIG. 5 illustrates an example of a diagram of a system 500 for estimating battery parameters in a rest period. For the sake of brevity, the descriptions of the FIGS. 4 and 5 are explained in conjunction with each other.

In some examples, the system 500 may be a part of the BMS 240. In another example, the system 500 may be a part of the electronic device 200 and may be connected to the BMS 240. The system 500 may include, but is not limited to, a processor 502, memory 505, components 506, and data store 508. The components 506 and the memory 505 may be coupled to the processor 502.

The description of memory 220 and the processor 230 of FIG. 2 is also applicable to the processor 502 and the memory 504 of FIG. 5, respectively, and are incorporated herein.

The components 506, amongst other things, include routines, programs, objects, components, data structures, and the like, which perform particular tasks or implement data types. The components 506 may also be implemented as signal processor(s), state machine(s), logic circuitries, and/or any other device or component that manipulate signals based on operational instructions.

Furthermore, the components 506 may be implemented in hardware, instructions executed by a processing unit, or by a combination thereof. The processing unit may include a computer, a processor, such as the processor 502, a state machine, a logic array, or any other suitable devices capable of processing instructions. The processing unit may be a general-purpose processor which executes instructions to cause the general-purpose processor to perform the required tasks or, the processing unit may be dedicated to performing the required functions. In another example of the present disclosure, the components 506 may be machine-readable instructions (e.g., software) which, when executed by a processor or processing unit, perform any of the described functionalities.

In an example, the components 506 may include a determiner 510, a calculator 512, and an estimator 514.

The various components 510 to 514 may be in communication with each other. In an example, the various components 510 to 514 may be a part of the processor 502. In another example, the processor 502 may be configured to perform the functions of the components 510 to 514. The data store 508 serves, amongst other things, as a repository for storing data processed, received, and generated by one or more of the components 506.

In an example, the processor 230 and memory 220 of the electronic device 200 may be coupled to the BMS 240 and may perform the functions of the processor 502 and memory 505 of the system 500.

FIG. 4 illustrates an example of a method 400 for estimating battery parameters, in accordance with an example of the present disclosure. In an example, the parameters are estimated in initial times and/or low diffusivity and low temperature. Initial times and/or low diffusivity and low temperature refer to when $\sqrt{(Dt)} \ll R$, where D may denote low diffusivity, t may denote an initial time, and R may denote a radius of an electrode particle.

Referring to FIG. 4, in operation 401, method 400 may determine whether a diffusion length of an intercalation material in an electrode of a battery is less than a threshold. In an example, the threshold may be a measure of length that is used to determine the adequacy, or lack thereof, of the diffusion length of the intercalation material in the electrode of the battery. In an example, the threshold may be preset or set in advance. In an example, the diffusion length of the intercalation material is determined based on the diffusivity D of the intercalation material in the electrode, the value of the time variable t, and/or a radius R of the electrode. Whether the diffusion length of the intercalation material is less than the threshold may be determined based on the diffusivity D of the intercalation material in the electrode, the value of the time variable t, and/or the radius R of the electrode. For example, the determiner 510 may determine that the diffusion length is less than the threshold when a square root of a product of the diffusivity of the intercalation material and the value of the time variable is less than a product of the radius of the electrode and a coefficient less than 1.

Figure 6:
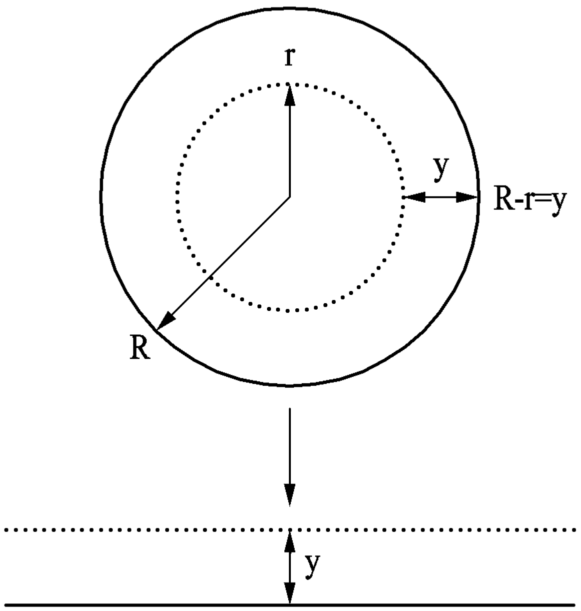
FIG. 6 illustrates an example of a diagram representing low diffusivity condition.

FIG. 6 illustrates an example of a diagram representing low diffusivity conditions. For example, the diffusion length may be less than the threshold if the following condition is satisfied.

$$\sqrt{Dt} \ll R \quad \text{Equation 1}$$

When the condition that $\sqrt{Dt} \ll R$ is satisfied, the concentration gradient due to the surface flux is confined to a boundary layer, y (=R−r), as shown in FIG. 6. Variable "r" is the radial distance from the center of the particle. Accordingly, the spherical coordinate mass conservation equations and boundary conditions are modified to reflect the presence and solve for the concentration profile inside this boundary layer. Due to the center of the particle being quite distant from the surface during this phase, a similarity solution is disclosed leading to a concentration profile in the spatial and temporal dimensions.

For example, in another example, the diffusion length may be less than the threshold if the following condition for both the electrodes, i.e., positive and negative electrodes, is satisfied.

$$t<0.04R2/D \quad \text{Equation 2}$$

In Equation 2, t is the value of the time variable, R is the radius of an electrode, and D is the diffusivity of the intercalation material in the electrode. Thereafter, in operation 403, the method 400 may include calculating a concentration C of the intercalation material in the electrode of the battery based on a result of the determination. In an example, the result of the determination may indicate that the diffusion length is less than the threshold. In an example, the parameters may include at least one of an equilibrium concentration $C_0$ of the intercalation material, a scaled concentration C* of the intercalation material, a reaction flux j, diffusivity D of the intercalation material in the electrode, or a value of a time variable t. For example, the calculator 512 may calculate the parameters including the equilibrium concentration of the intercalation material, the scaled concentration of the intercalation material, the reaction flux, the diffusivity of the intercalation material in the electrode, and the value of the time variable when it is determined that the diffusion length is less than the threshold. The calculator 512 may calculate the concentration of the intercalation material based on the calculated parameters. In some examples, the calculator 512 calculates the concentration C of the intercalation material in response to the determination that a diffusion length of each of the positive electrode 310 and the negative electrode 320 of the battery 300 is less than the threshold. Then, the calculator 512 may calculate the concentration C of the intercalation material using the below equation.

$$C^* = \frac{C - C_0}{j\sqrt{\frac{t}{D}}} \quad \text{Equation 3}$$

In equation 3, scaled concentration C* of the intercalation material, c is the concentration of the intercalation material, $C_0$ is the equilibrium concentration of the intercalation material, D is the diffusivity of the intercalation material in the electrode, j is the reaction flux, and t is the value of the time variable. Further, the calculator 512 may calculate a scaled concentration C* of the intercalation material based on a similarity variable ξ using the below equation.

$$C^* = -\xi + \frac{2}{\sqrt{\pi}\, e^{\frac{\xi^2}{4}}} + \xi\,\mathrm{erf}\left(\frac{\xi}{2}\right) \quad \text{Equation 4}$$

In an example, the calculator 512 may calculate the similarity variable based on a thickness y of a boundary of the electrode, the diffusivity D of the intercalation material in the electrode, and/or the value of the time variable t. The calculator 512 may calculate the similarity variable ξ using the below equation.

$$\xi = \frac{y}{\sqrt{Dt}} \quad \text{Equation 5}$$

Referring back to operation 401, if the determiner 510 determines that the intercalation flux J of the battery 300 does not satisfy the preset condition, then the calculator 512 may calculate the concentration C of the intercalation material using existing techniques.

Referring to FIG. 4, in operation 405, the method 400 includes estimating at least one battery parameter of the battery parameters based on the calculated concentration C of the intercalation material in the electrode. In an example, the battery parameters may include a state of health (SOH) of the battery 300, an SOC of the battery 300, electrochemical parameters of the battery 300, and a state of short (SOS) of the battery 300. In some examples, the estimator 514 may estimate the SOC of the battery 300 using the open circuit voltage V and electrode time constant dependent logarithmic voltage profiles. Similarly, the estimator 514 may estimate the electrochemical parameters (such as solid state diffusion, cell resistance, etc.) using the open circuit voltage V and electrode time constant dependent logarithmic voltage profiles. In addition, the estimator 514 may estimate at least one of the SOH or SOS of the battery 300 based on the estimated electrochemical parameters. For example, the estimator 514 may update the existing electrochemical parameter with the estimated electrochemical parameter to accurately estimate the SOH and/or SOS of battery 300.

Figure 7A:
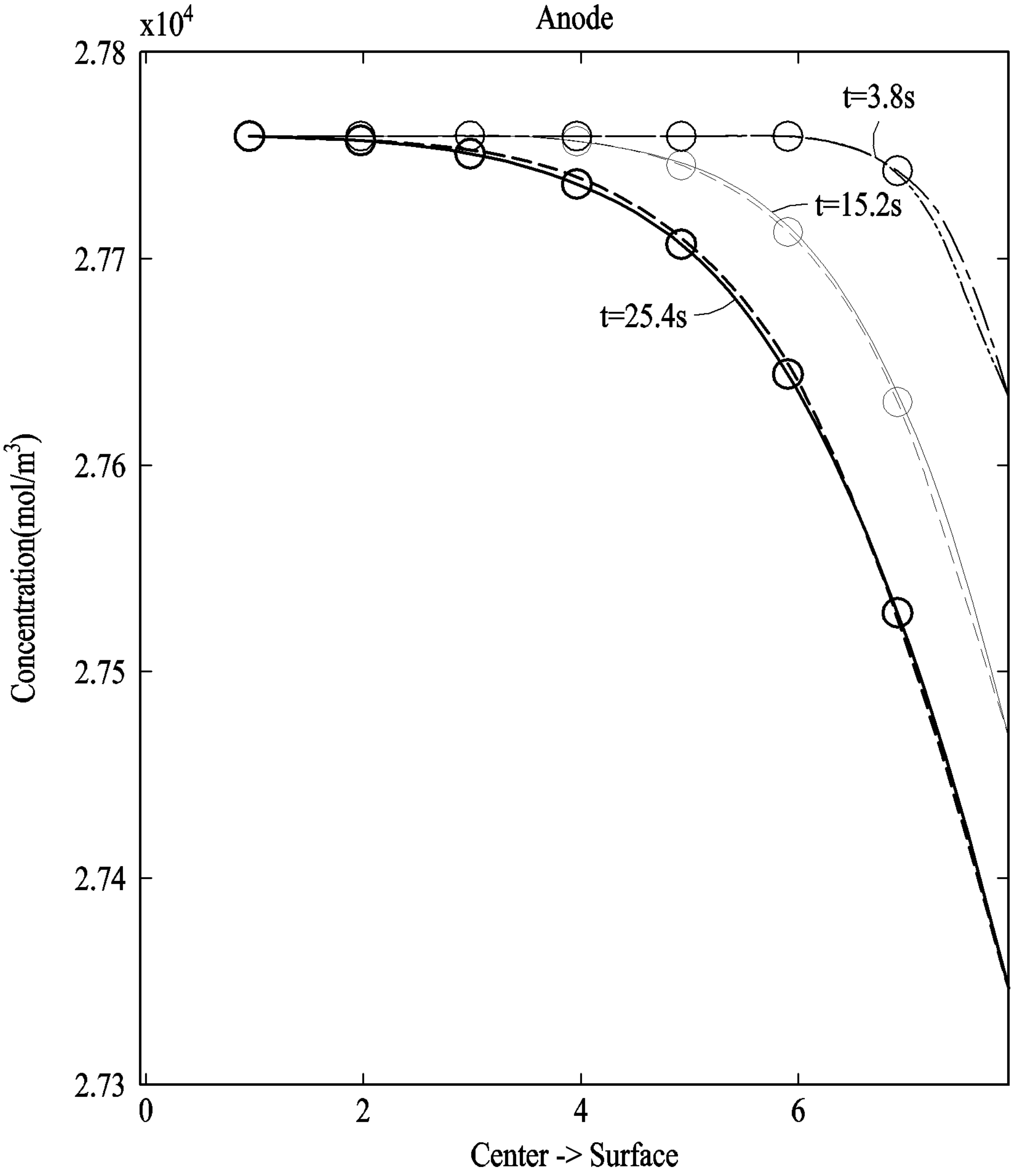
FIGS. 7A and 7B illustrate an example of a graph representing comparison between actual and estimated concentration profiles of a battery.
Figure 7B:
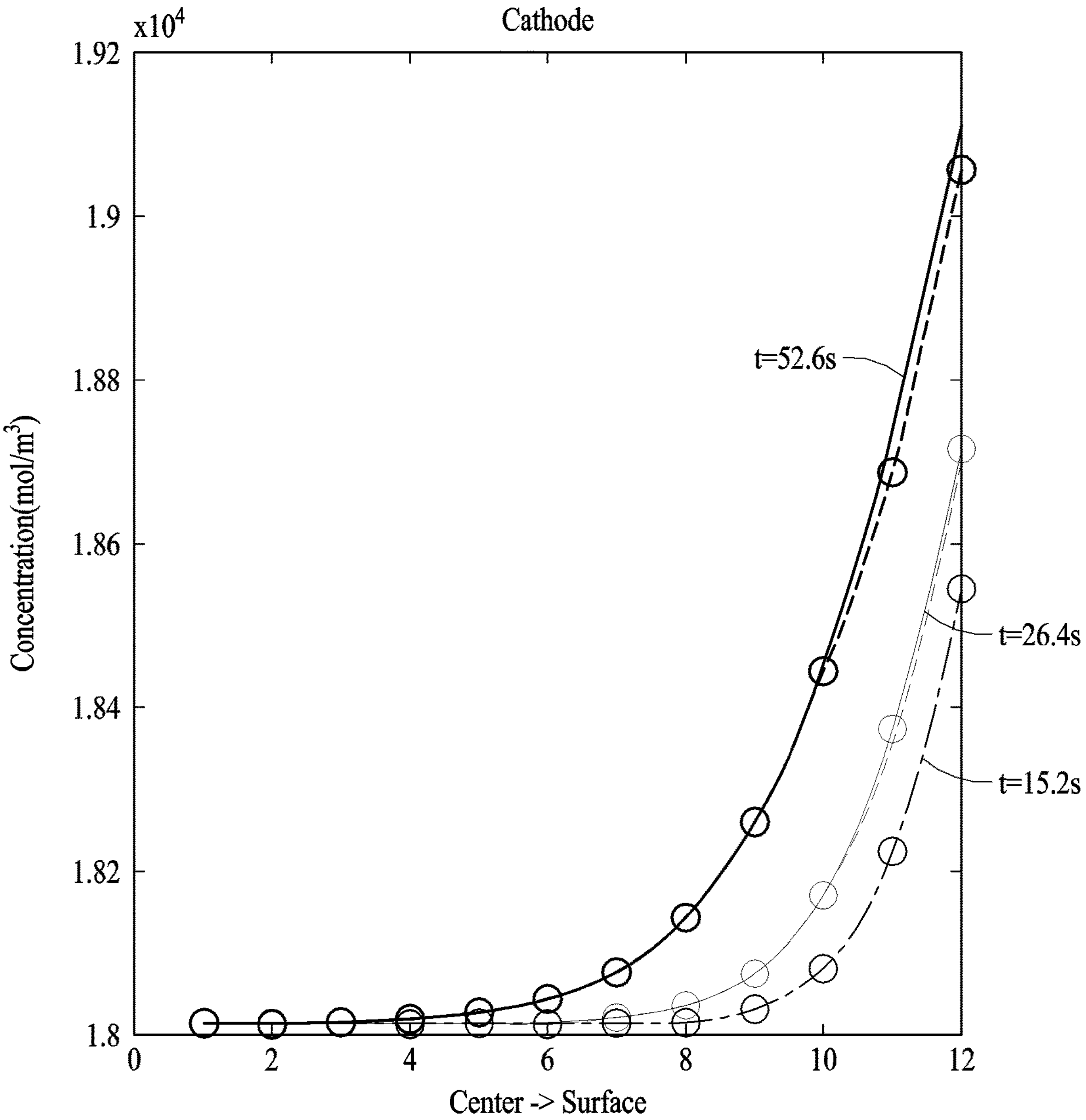

FIGS. 7A and 7B illustrate an example of a graph representing comparison between actual and estimated concentration profile of a battery. In FIG. 7A, comparison between the estimated concentration profile of the positive electrode, i.e., anode, at different times is similar to an actual concentration profile of the positive electrode. The solid line curves show an actual concentration profile of the positive electrode, and the dotted curves show an estimated concentration profile of the positive electrode using the disclosed techniques. As clearly shown in FIG. 7A, the concentration profile predicted by the disclosed technique is similar to the concentration profile of the positive electrode.

Similarly, in FIG. 7B, comparison between the estimated concentration profile of the negative electrode, i.e., cathode, at different times is similar to an actual concentration profile of the negative electrode. The solid line curves show the actual concentration profile of the negative electrode, and the dotted curves show the estimated concentration profile of the negative electrode using the disclosed techniques. As clearly shown in FIG. 7B, the concentration profile predicted by the disclosed technique is similar to the concentration profile of the negative electrode.

Thus, the disclosed techniques provide one or more of the following advantages:

1) more accurate estimation of SOC of a battery in low diffusivity;
2) more accurate estimation of SOC of a battery at low temperature;
3) more accurate estimation of SOC of a battery with a large particle radius;
4) more accurate estimation of SOH of the battery; and
5) safer batteries by avoiding over-charge/over-discharge to avoid short circuits.

The drawings and the forgoing description give examples of embodiments. Those skilled in the art will appreciate that one or more of the described elements may well be combined into a single functional element. In another example, certain elements may be split into multiple functional elements. Elements from one embodiment may be added to another embodiment. For example, orders of processes described herein may be changed and are not limited to the manner described herein.

The scope of the embodiments is by no means limited by these specific examples. Numerous variations, whether explicitly given in the specification or not, such as differences in structure, dimension, and use of material, are possible. The scope of embodiments is at least as broad as is given by the following claims.

Disclosed above are quick and accurate SOC estimation methods and apparatuses for addressing low characteristic diffusivity lengths for BMS.

The computing apparatuses, the electronic devices, the processors, the memories, and other components described herein with respect to FIGS. 1-6 are implemented by or representative of hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in the figures that perform the operations described in this application are performed by computing hardware, for example, by one or more processors or computers, implemented as described above implementing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions herein, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-Res, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of estimating battery parameters performed by a processor, the method comprising:
- determining whether a diffusion length of an intercalation material in an electrode of a battery is lesser than a threshold;
- calculating a concentration of the intercalation material in the electrode based on a result of the determination;
- estimating at least one battery parameter of the battery parameters based on the concentration of the intercalation material; and
- controlling at least one of charging of the battery, discharging of the battery, or detection of short circuits of the battery based on the estimated at least one battery parameter.

2. The method of claim 1, wherein the determining of whether the diffusion length of the intercalation material is lesser than the threshold comprises determining whether the diffusion length is lesser than the threshold based on a diffusivity of the intercalation material in the electrode, a value of a time variable, and a radius of the electrode.

3. The method of claim 1, wherein the determining of whether the diffusion length of the intercalation material is lesser than the threshold comprises determining that the diffusion length is lesser than the threshold in response to a square root of a product of a diffusivity of the intercalation material and a value of a time variable being lesser than a product of a radius of the electrode and a coefficient less than 1.

4. The method of claim 1, wherein the calculating of the concentration of the intercalation material comprises:
- calculating parameters comprising an equilibrium concentration of the intercalation material, a scaled concentration of the intercalation material, a reaction flux, a diffusivity of the intercalation material in the electrode, and a value of a time variable, in response to the diffusion length of the intercalation material being lesser than the threshold; and
- calculating a concentration of the intercalation material based on the parameters.

5. The method of claim 1, wherein the calculating of the concentration of the intercalation material comprises calculating a scaled concentration of the intercalation material based on a similarity variable.

6. The method of claim 5, wherein the calculating of the scaled concentration comprises calculating the similarity variable based on a thickness of a boundary of the electrode, a diffusivity of the intercalation material in the electrode, and a value of a time variable.

7. The method of claim 1, wherein the estimating of the at least one battery parameter comprises estimating at least one of a state of health of the battery, a state of charge of the battery, electrochemical parameters of the battery, or a state of short of the battery.

8. The method of claim 1, wherein the estimating of the at least one battery parameter comprises estimating at least one of a state of charge of the battery or electrochemical parameters of the battery based on an open circuit voltage and electrode time constant dependent logarithmic voltage profiles.

9. The method of claim 1, wherein the estimating of the at least one battery parameter comprises:
- estimating electrochemical parameters of the battery; and
- estimating at least one of a state of health of the battery or a state of short of the battery based on the electrochemical parameters.

10. A non-transitory computer-readable storage medium storing instructions that, when executed by a processor, cause the processor to perform the method of claim 1.

11. An electronic device for estimating battery parameters, the electronic device comprising:
- one or more processors; and
- a memory comprising one or more non-transitory storage media that store instructions that, when executed by the one or more processors, configures the device to:
  - determine whether a diffusion length of an intercalation material in an electrode of a battery is less than a threshold;
  - calculate a concentration of the intercalation material in the electrode based on a result of the determination;
  - estimate at least one battery parameter of the battery parameters based on the concentration of the intercalation material; and
  - control at least one of charging of the battery, discharging of the battery, or detection of short circuits of the battery based on the estimated at least one battery parameter.

12. The electronic device of claim 11, wherein the execution of the instructions further configures the one or more processors to determine whether the diffusion length is lesser than the threshold based on a diffusivity of the intercalation material in the electrode, a value of a time variable, and a radius of the electrode.

13. The electronic device of claim 11, wherein the execution of the instructions further configures the one or more processors to determine that the diffusion length is lesser than the threshold in response to a square root of a product of a diffusivity of the intercalation material and a value of a time variable being lesser than a product of a radius of the electrode and a coefficient less than 1.

14. The electronic device of claim 11, wherein the execution of the instructions further configures the one or more processors to:
- calculate parameters comprising an equilibrium concentration of the intercalation material, a scaled concentration of the intercalation material, a reaction flux, a diffusivity of the intercalation material in the electrode, and a value of a time variable, in response to the diffusion length of the intercalation material being lesser than the threshold; and
- calculate a concentration of the intercalation material based on the parameters.

15. The electronic device of claim 11, wherein the execution of the instructions further configures the one or more processors to calculate a scaled concentration of the intercalation material based on a similarity variable.

16. The electronic device of claim 15, wherein the execution of the instructions further configures the one or more processors to calculate the similarity variable based on a thickness of a boundary of the electrode, a diffusivity of the intercalation material, and a value of a time variable.

17. The electronic device of claim 11, wherein the execution of the instructions further configures the one or more processors to estimate at least one of a state of health of the battery, a state of charge of the battery, electrochemical parameters of the battery, or a state of short of the battery.

18. The electronic device of claim 11, wherein the execution of the instructions further configures the one or more processors to estimate at least one of a state of charge of the battery or electrochemical parameters of the battery based on an open circuit voltage and electrode time constant dependent logarithmic voltage profiles.

19. The electronic device of claim 11, wherein the execution of the instructions further configures the one or more processors to:

estimate electrochemical parameters of the battery; and estimate at least one of a state of health of the battery or a state of short of the battery based on the electrochemical parameters.

20. The electronic device of claim 11, wherein the execution of the instructions further configures the one or more processors to calculate the concentration of the intercalation material in the electrode, in response to a diffusion length of a positive electrode and a negative electrode of the battery being lesser than the threshold.

* * * * *